United States Patent
Cao et al.

(10) Patent No.: US 9,589,829 B1
(45) Date of Patent: Mar. 7, 2017

(54) FINFET DEVICE INCLUDING SILICON OXYCARBON ISOLATION STRUCTURE

(71) Applicant: GLOBALFOUNDRIES Inc., Grand Cayman (KY)

(72) Inventors: Huy M. Cao, Rexford, NY (US); Daniel Jaeger, Saratoga Springs, NY (US); Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/982,872

(22) Filed: Dec. 29, 2015

(51) Int. Cl.
| H01L 29/66 | (2006.01) |
| H01L 21/02 | (2006.01) |
| H01L 29/78 | (2006.01) |
| H01L 21/762 | (2006.01) |
| H01L 29/06 | (2006.01) |

(52) U.S. Cl.
CPC .... H01L 21/76224 (2013.01); H01L 29/0649 (2013.01); H01L 29/66795 (2013.01); H01L 29/785 (2013.01); H01L 21/0217 (2013.01)

(58) Field of Classification Search
CPC ........... H01L 29/66795; H01L 29/7843; H01L 29/785; H01L 21/0217; H01L 21/02247; H01L 29/7848; H01L 29/165

USPC .......................................................... 438/478
See application file for complete search history.

(56) References Cited

U.S. PATENT DOCUMENTS

| 2014/0070322 | A1* | 3/2014 | Jacob | H01L 21/823431 257/368 |
| 2015/0318393 | A1* | 11/2015 | Masuoka | H01L 29/66545 257/329 |
| 2016/0064289 | A1* | 3/2016 | Xiao | H01L 21/8258 257/369 |
| 2016/0163833 | A1* | 6/2016 | He | H01L 29/66795 257/401 |

* cited by examiner

Primary Examiner — Thomas L Dickey
Assistant Examiner — Changhyun Yi
(74) Attorney, Agent, or Firm — Amerson Law Firm, PLLC

(57) ABSTRACT

A method includes forming a plurality of fins on a semiconductor substrate by defining a plurality of trenches in the substrate. A first insulating material layer comprising silicon, oxygen and carbon is formed in the trenches between the plurality of fins. The first insulating material layer has an upper surface that is at a level that is below an upper surface of the fins. A second insulating material layer is formed above the first insulating material layer. The second insulating material layer is planarized to expose a top surface of the plurality of fins. The second insulating material layer is removed to expose the first insulating material layer.

20 Claims, 4 Drawing Sheets

FINFET DEVICE INCLUDING SILICON OXYCARBON ISOLATION STRUCTURE

BACKGROUND OF THE INVENTION

1. Field of the Invention

The present disclosure generally relates to the fabrication of semiconductor devices, and, more particularly, to a finFET device including a silicon oxycarbon (SiOC) isolation structure and methods for making same.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

In some applications, fins for FinFET devices are formed such that the fin is vertically spaced apart from and above the substrate with an isolation material positioned between the fin and the substrate. FIG. 1 is a perspective view of an illustrative prior art FinFET semiconductor device 100 that is formed above a semiconductor substrate 105 at an intermediate point during fabrication. In this example, the FinFET device 100 includes three illustrative fins 110, an isolation structure 130, a gate structure 115, sidewall spacers 120 and a gate cap layer 125. The fins 110 have a three-dimensional configuration: a height, a width, and an axial length. The portions of the fins 110 covered by the gate structure 115 are the channel regions of the FinFET device 100, while the portions of the fins 110 positioned laterally outside of the spacers 120 are part of the source/drain regions of the device 100. Although not depicted, the portions of the fins 110 in the source/drain regions may have additional epi semiconductor material formed thereon in either a merged or unmerged condition.

One technique for forming the isolation structure 130 includes forming a first oxide layer using a flowable chemical vapor deposition (FCVD) process to fill the gaps between the fins 110, performing an annealing process to densify the first oxide layer, and forming a second oxide layer (e.g., tetraethyl orthosilicate (TEOS)) (not separately shown) above the densified first oxide layer. Subsequently, a planarization process is performed to expose a cap layer (not shown) disposed above the fins 110 and a wet etch process is performed to recess the remaining oxide to create the isolation structure 130 illustrated in FIG. 1.

The annealing process to densify the first oxide layer increases the thermal budget and may also create inherent stress in the structure, leading to an undesirable bending of the vertical axis of the fins 110. The planarization process also introduces variations that depend on the pitch between the fins 110. Regions with increased pitch experience increased dishing of the second oxide layer relative to regions with increased pitch. As a result, the height of the isolation structure 130 may vary after the wet etch across the different regions of the substrate, causing an associated variation in fin height.

The present disclosure is directed to various methods of forming isolation structures on FinFET devices and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming isolation structures on FinFET semiconductor devices. One illustrative method includes, among other things, forming a plurality of fins on a semiconductor substrate by defining a plurality of trenches in the substrate. A first insulating material layer comprising silicon, oxygen and carbon is formed in the trenches between the plurality of fins. The first insulating material layer has an upper surface that is at a level that is below an upper surface of the fins. A second insulating material layer is formed above the first insulating material layer. The second insulating material layer is planarized to expose a top surface of the plurality of fins. The second insulating material layer is removed to expose the first insulating material layer.

Another method includes forming a plurality of fins on a semiconductor substrate. A cap layer is positioned above the plurality of fins. A layer comprising an SiOC layer is formed between the plurality of fins. A layer comprising silicon oxide is formed above the SiOC layer. The silicon oxide layer is planarized to expose the cap layer. The silicon oxide layer is removed to expose the SiOC layer.

A device includes, among other things, a plurality of fins defined by a plurality of trenches in a substrate. An insulating material layer comprising silicon, oxygen and carbon is in the trenches between the plurality of fins. The first insulating material layer has an upper surface that is at a level that is below an upper surface of the fins. A liner material is positioned between the insulating material and the plurality of fins.

BRIEF DESCRIPTION OF THE DRAWINGS

The disclosure may be understood by reference to the following description taken in conjunction with the accompanying drawings, in which like reference numerals identify like elements, and in which.

Figure 1:
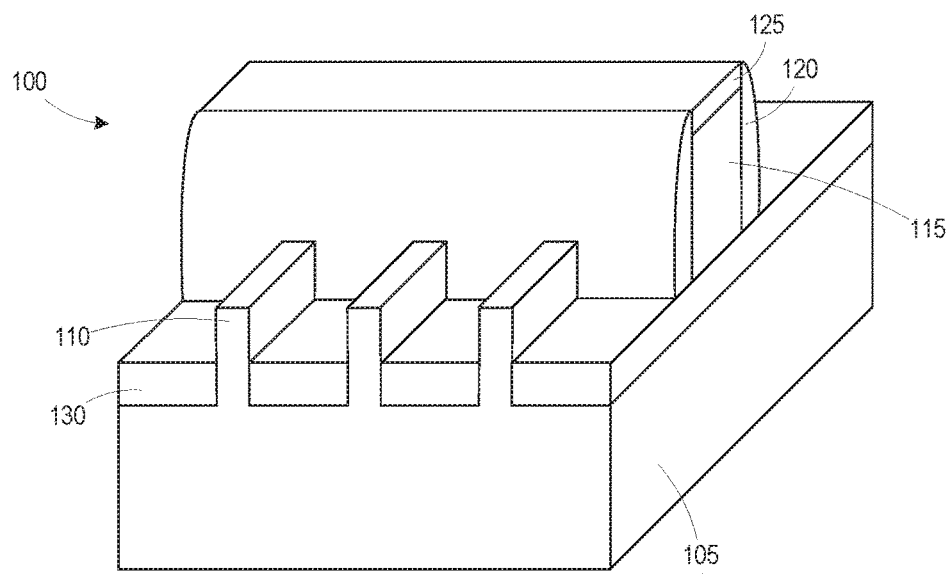
FIG. 1 schematically depicts an illustrative prior art finFET device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a finFET device with a silicon oxycarbon isolation structure. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

Figure 2A:
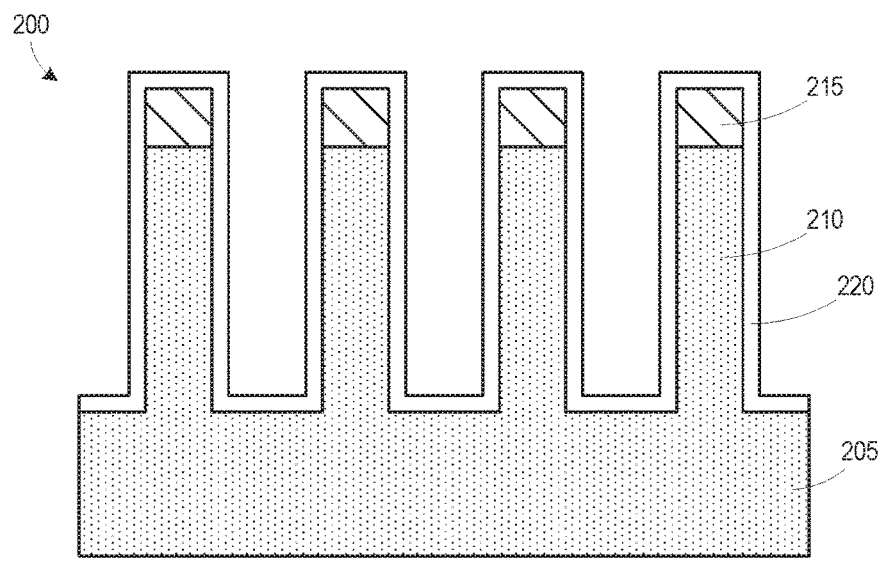
FIGS. 2A-2F depict various methods disclosed herein of forming a finFET device with a silicon oxycarbon isolation structure.

FIGS. 2A-2F illustrate various methods for forming a finFET device 200. FIGS. 2A-2F show a cross-sectional view (in the gate width direction of the device 200). In FIG. 2A, the device 200 includes a substrate 205 with a plurality of fins 210 defined thereon. The substrate 205 may have a variety of configurations, such as the depicted bulk silicon configuration. The substrate 205 may also have a silicon-on-insulator (SOI) configuration that includes a bulk silicon layer, a buried insulation layer and an active layer, wherein semiconductor devices are formed in and above the active layer. The substrate 205 may be formed of silicon or silicon germanium or it may be made of materials other than silicon, such as germanium. Thus, the terms "substrate" or "semiconductor substrate" should be understood to cover all semiconducting materials and all forms of such materials. The substrate 205 may have different layers. For example, the fins 210 may be formed in a separate process layer formed above a base layer of the substrate 205, i.e., in the active layer of an SOI substrate. After performing various deposition and etching processes, FIG. 2A depicts the device 200 at a point in processing wherein a patterned cap layer 215 (e.g., silicon nitride) is positioned above the fins 210. In one example, the cap layer 215 was used as a hard mask for etching the fins 210 in the substrate 205. After forming the fins 110, a liner 220 was formed over the fins 210 by performing a conformal deposition process. The liner 220 may include a single layer of material (such as silicon dioxide or silicon nitride) or multiple layers of material, such as alternating layers of silicon oxide and silicon nitride, to protect the fins 210 during processing.

Figure 2B:
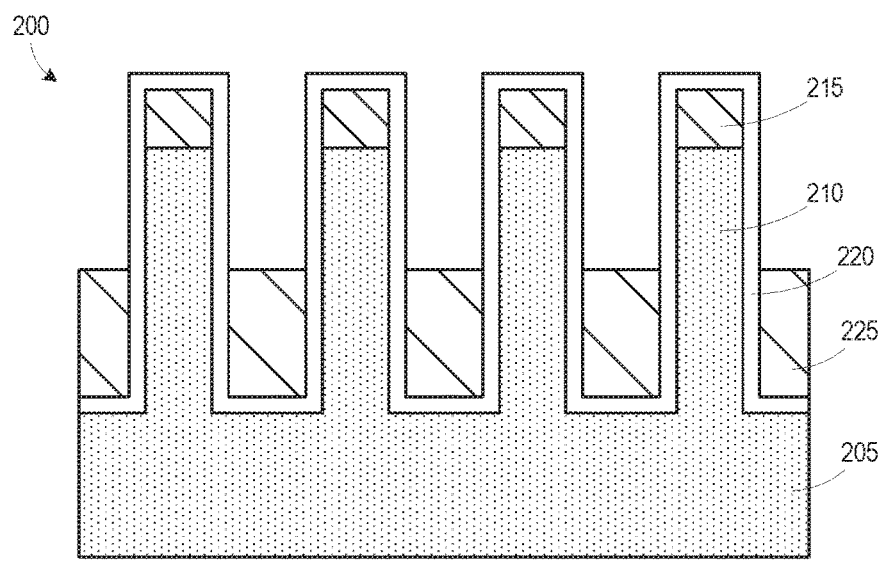

FIG. 2B illustrates the device 200 after several process operations were performed to form a recessed first insulating material layer 225 including at least silicon, oxygen and carbon (e.g., silicon oxycarbon (SiOC) or silicon nitrogen oxycarbon (SiCON)) between the fins 210. In one embodiment, the first insulating material layer 225 may be formed by overfilling the trenches between the fins 215, planarizing the first insulating material layer 225, and performing an etch process to recess the first insulating material layer 225 to the height illustrated in FIG. 2B. In another embodiment, the deposition process may be controlled so that the first insulating material layer 225 is initially formed to the height shown in FIG. 2B. In one illustrated embodiment, the approximate atomic percentage composition of the silicon, carbon and oxygen in the first insulating material layer 225 may be:

$Si=30\%+/-10\%$
$O=50\%+/-10\%$
$C=10\%+/-5\%$

Figure 2C:
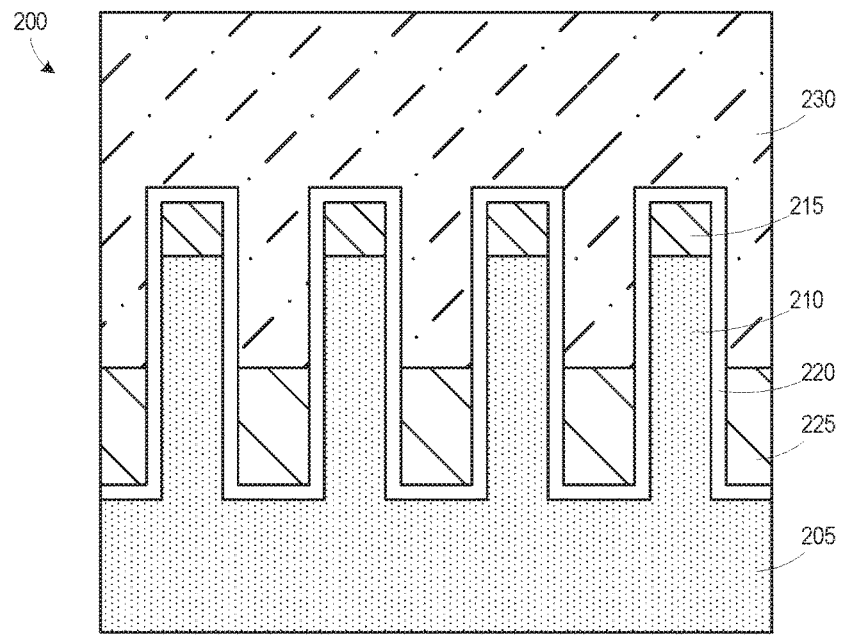

FIG. 2C illustrates the device 200 after a deposition process (e.g., flowable chemical vapor deposition) was performed to form a second insulating material layer 230 (e.g., silicon oxide) above the first insulating material layer 225.

Figure 2D:
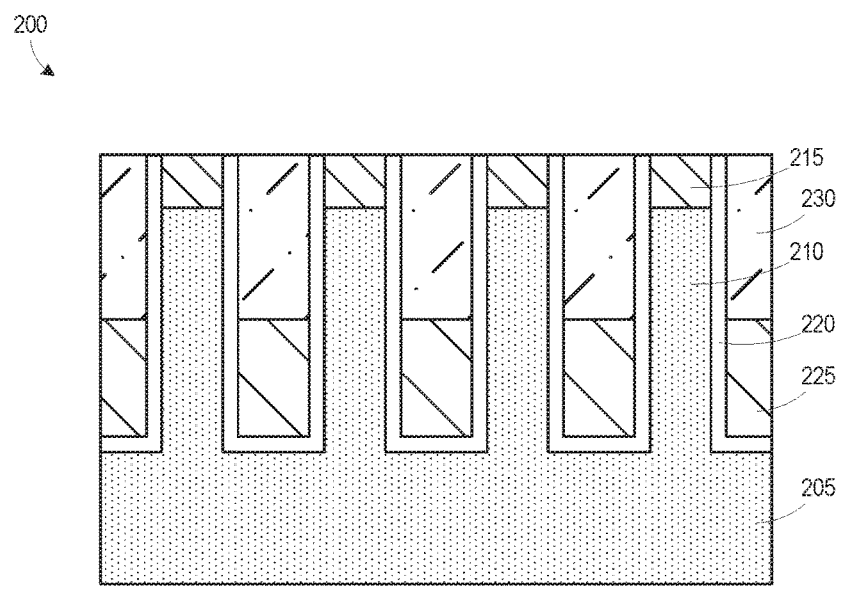

FIG. 2D illustrates the device 200 after one or more planarization processes were performed to reduce the thickness of the second insulating material layer 230 and expose the cap layer 215. Additional process steps (not shown) may be performed after exposing the cap layer 215, such as the selective cutting or removing of portions of some of the fins 210.

Figure 2E:
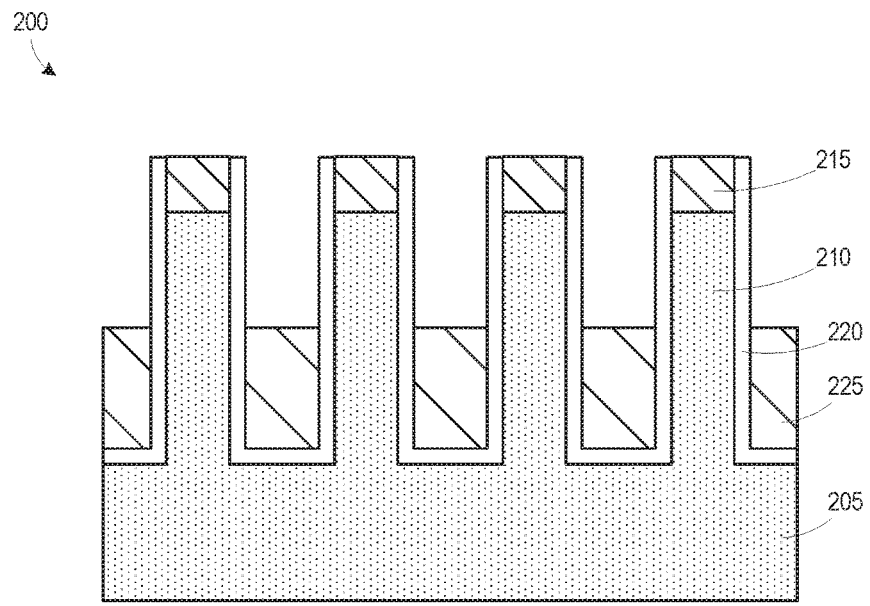

FIG. 2E illustrates the device 200 after a selective etch process was performed to selectively remove the second insulating material layer 230 relative to the first layer of insulating material 225, the liner 220, and the cap layer 215. In some embodiments, the selective etch process may be performed using a wet etch, such as a diluted hydrofluoric acid (DHF) etch (e.g., 100:1 volume ratio of water to HF) or a dry etch using an ammonium salt (e.g., a blend of $NH_3$ and $NF_3$). As a result, the underlying first insulating material layer 225 is exposed within the trenches between the fins 210. Due to the presence of the carbon in the first insulating material layer 225, the etch selectivity between the second insulating material layer 230 and the underlying first insulating material layer 225 is high, so that the etch process substantially terminates when the first insulating material layer 225 is exposed, although there might be some minimal etching of the first insulating material layer 225 since no etching process exhibits perfect etch selectivity. Any variation in the thickness of the second insulating material layer 230 generated by the planarization process is removed, since the recessing terminates on the layer 225 based on relative etch selectivity.

Figure 2F:
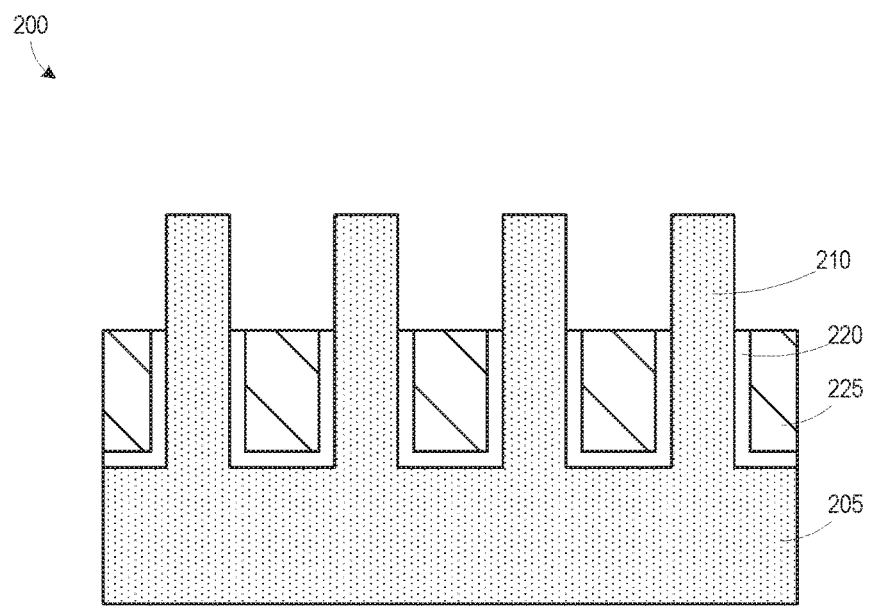

FIG. 2F illustrates the device 200 after an etch process was performed to selectively remove exposed portions of the liner 220 and the cap layer 215 relative to the surrounding materials, thereby exposing portions of the fins 210.

At the point of processing depicted in FIG. 2F, additional processing steps (not shown) may be performed to complete fabrication of the device 200, such as the forming of a gate electrode structure and implantation steps to dope source/drain regions of the device 200. Silicidation processes may be performed to form contact areas on the device 200, and subsequent metallization layers and interconnect lines and vias may be formed. Other layers of material, such as a stress-inducing contact etch stop layer and the like, may be present but are not depicted in the attached drawings.

The use of the first insulating material layer 225 that includes silicon, oxygen and carbon as described above reduces the complexity of the process flow by eliminating the annealing step in the conventional process flow, which reduces the likelihood of fin bending and reduces the thermal budget. The removal of the second insulating material layer 230 is self-aligning in the sense that the etching process performed to remove the second insulating material layer 230 terminates based on etch selectivity between the second insulating material layer 230 and the underlying first insulating material layer 225, thereby reducing height variations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a plurality of fins on a semiconductor substrate by defining a plurality of trenches in the substrate;
   forming a first insulating material layer comprising silicon, oxygen and carbon in the trenches between the plurality of fins, the first insulating material layer having an upper surface that is at a level that is below an upper surface of the plurality of fins;
   forming a non-conformal second insulating material layer above and directly contacting the first insulating material layer, wherein an entire upper surface of the second insulating material layer has a height greater than the upper surface of the plurality of fins;
   planarizing the second insulating material layer to expose the upper surface of the plurality of fins;
   performing at least one process step on the exposed plurality of fins; and
   removing all of the second insulating material layer to expose the first insulating material layer after performing the at least one process step.

2. The method of claim 1, wherein a cap layer is formed above the plurality of fins and planarizing the second insulating material layer comprises planarizing the second insulating material layer to expose the cap layer.

3. The method of claim 1, wherein forming the first insulating material layer comprises performing a first flowable chemical vapor deposition process.

4. The method of claim 3, wherein forming the second insulating material layer comprises performing a second flowable chemical vapor deposition process.

5. The method of claim 1, wherein a cap layer is formed above the plurality of fins, a liner is formed above the cap layer and the plurality of fins, and planarizing the second insulating material layer comprises planarizing the second insulating material layer to expose the cap layer.

6. The method of claim 5, further comprising removing the cap layer and portions of the liner exposed by the removing of the second insulating material layer.

7. The method of claim 1, wherein the first insulating material layer comprises nitrogen.

8. The method of claim 1, wherein removing the second insulating material layer comprises performing a wet etch process.

9. A method, comprising:
   forming a plurality of fins on a semiconductor substrate, wherein a cap layer is positioned above the plurality of fins;
   forming a layer comprising SiOC between the plurality of fins, the layer comprising SiOC having an upper surface that is at a level that is below an upper surface of the plurality of fins;
   forming a non-conformal layer comprising silicon oxide above and directly contacting the layer comprising SiOC, wherein an entire upper surface of the layer comprising silicon dioxide has a height greater than the upper surface of the plurality of fins;
   planarizing the layer comprising silicon oxide to expose the cap layer;
   performing at least one process step on the exposed plurality of fins; and
   removing all of the layer comprising silicon oxide to expose the layer comprising SiOC after performing the at least one process step.

10. The method of claim 9, wherein forming the layer comprising SiOC comprises performing a first flowable chemical vapor deposition process.

11. The method of claim 10, wherein forming the layer comprising silicon oxide comprises performing a second flowable chemical vapor deposition process.

12. The method of claim 9, wherein a liner is formed above the cap layer and the plurality of fins, and planarizing the layer comprising silicon oxide comprises planarizing the layer comprising silicon oxide to expose the cap layer.

13. The method of claim 12, further comprising removing the cap layer and portions of the liner exposed by the removing of the layer comprising silicon oxide.

14. The method of claim 9, wherein the layer comprising SiOC further comprises nitrogen.

15. The method of claim 9, wherein removing the layer comprising silicon oxide comprises performing a wet etch process.

16. A method comprising:
   forming a plurality of fins on a semiconductor substrate by defining a plurality of trenches in the substrate;
   performing a first flowable chemical vapor deposition process to form a first insulating material layer comprising silicon, oxygen and carbon in the trenches between the plurality of fins, the first insulating material layer having an upper surface that is at a level that is below an upper surface of the plurality of fins;

performing a second flowable chemical vapor deposition process to form a non-conformal second insulating material layer directly contacting the first insulating material layer, wherein an entire upper surface of the second insulating material layer has a height greater than the upper surface of the plurality of fins;

planarizing the second insulating material layer to expose the upper surface of the plurality of fins;

performing at least one process step on the exposed plurality of fins; and removing all of the second insulating material layer to expose the first insulating material layer after performing the at least one process step.

17. The method of claim 16, wherein a cap layer is formed above the plurality of fins and planarizing the second insulating material layer comprises planarizing the second insulating material layer to expose the cap layer.

18. The method of claim 16, wherein a cap layer is formed above the plurality of fins, a liner is formed above the cap layer and the plurality of fins, and planarizing the second insulating material layer comprises planarizing the second insulating material layer to expose the cap layer, further comprising removing the cap layer and portions of the liner exposed by the removing of the second insulating material layer.

19. The method of claim 16, wherein the first insulating material layer comprises nitrogen.

20. The method of claim 16, wherein removing the second insulating material layer comprises performing a wet etch process.

* * * * *